United States Patent
Chen

(10) Patent No.: US 6,754,078 B1
(45) Date of Patent: Jun. 22, 2004

(54) HEAT DISSIPATING DEVICE WITH SLANTING ENGAGED HEAT DISSIPATING SHEETS AND BOTTOM PLATE

(76) Inventor: Shyh-Ming Chen, 235 Chung-Ho Box 8-24, Taipei (TW)

(*) Notice: Subject to any disclaimer, the term of this patent is extended or adjusted under 35 U.S.C. 154(b) by 0 days.

(21) Appl. No.: 10/376,042

(22) Filed: Mar. 3, 2003

(51) Int. Cl.$^7$ ................................................ H05K 7/20
(52) U.S. Cl. ........................ 361/709; 361/704; 361/710; 257/706; 165/80.3; 165/185; 174/16.3
(58) Field of Search ................................. 361/704, 709, 361/710; 257/706, 722; 174/16.3; 165/80.3, 185

(56) References Cited

U.S. PATENT DOCUMENTS

| | | | |
|---|---|---|---|
| 5,038,858 A | * 8/1991 | Jordan et al. | 165/185 |
| 5,791,406 A | * 8/1998 | Gonner et al. | 165/185 |
| 5,960,871 A | * 10/1999 | Chen | 165/185 |
| 6,134,783 A | * 10/2000 | Bargman et al. | 29/890.03 |
| 6,267,178 B1 | * 7/2001 | Chen | 165/185 |
| 6,520,248 B2 | * 2/2003 | Gailus et al. | 165/80.3 |

* cited by examiner

Primary Examiner—Boris Chervinsky

(57) ABSTRACT

A heat dissipating device comprises a bottom plate and plurality of heat dissipating sheets. A surface of the bottom plate is formed with a plurality of inclined recesses which are spaced with an equal space. Each inclined recess is inclined to a surface of the bottom plate and has two parallel sides, and every two adjacent recesses are spaced by a respective protruding rib. One end of each heat dissipating sheet has an inclined extending portion which has two parallel sides and is inclined to other portion of the heat dissipating sheet. The extending portions are inserted into the recesses of the bottom plate. By above structure, the heat dissipating sheets are inserted into the recesses of the bottom plate.

2 Claims, 5 Drawing Sheets

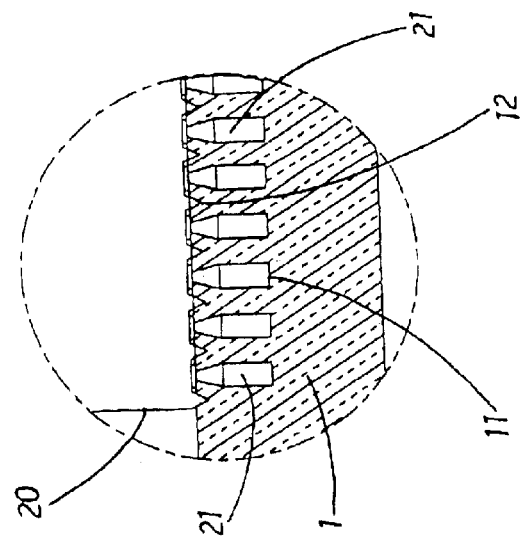
FIG. 1-B
PRIOR ART
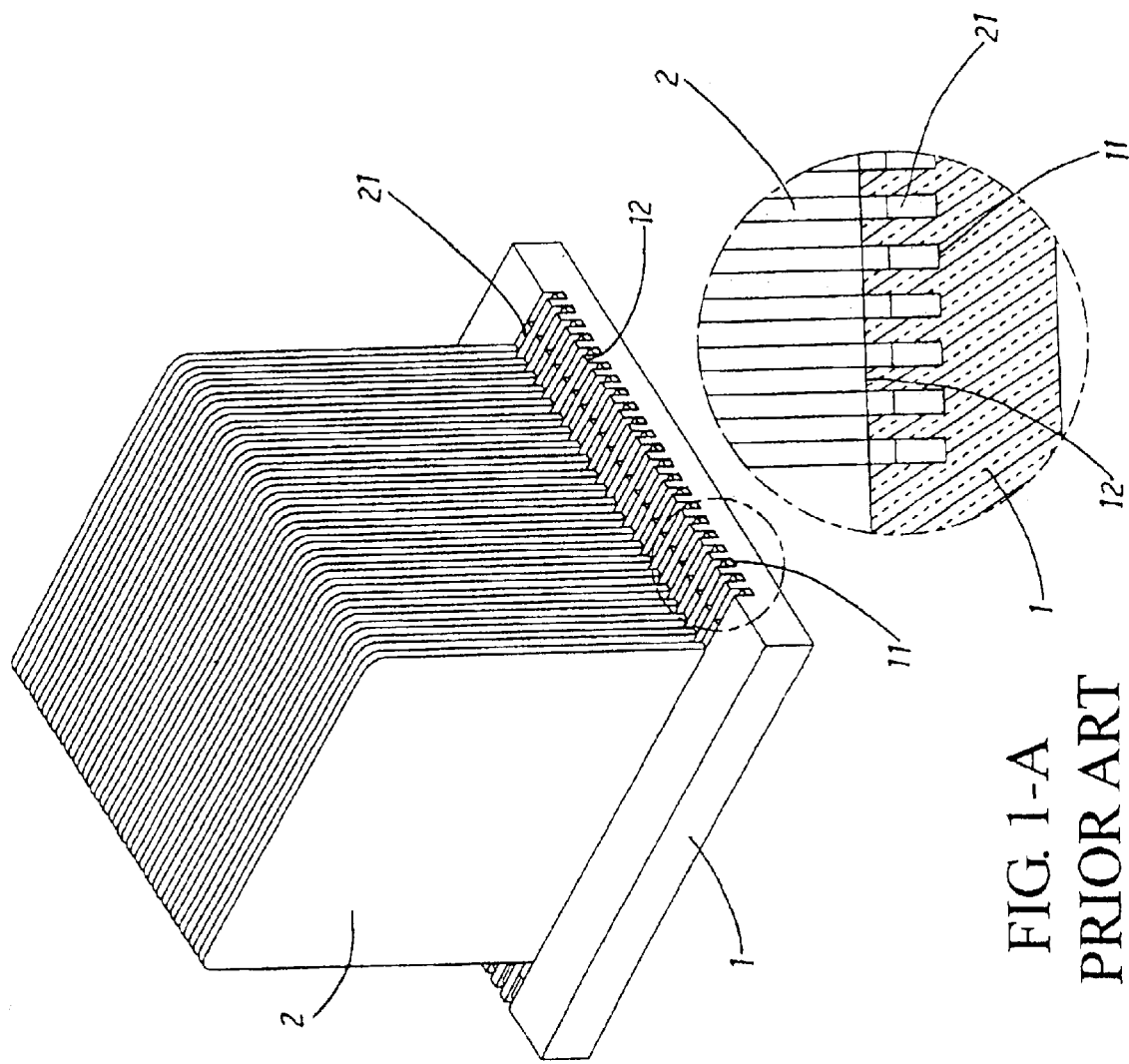
FIG. 1-A
PRIOR ART

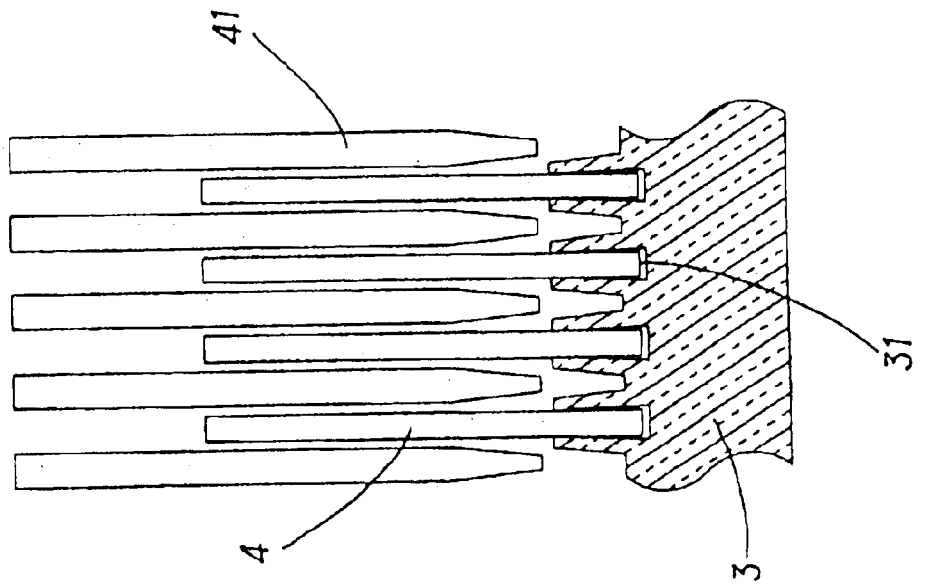
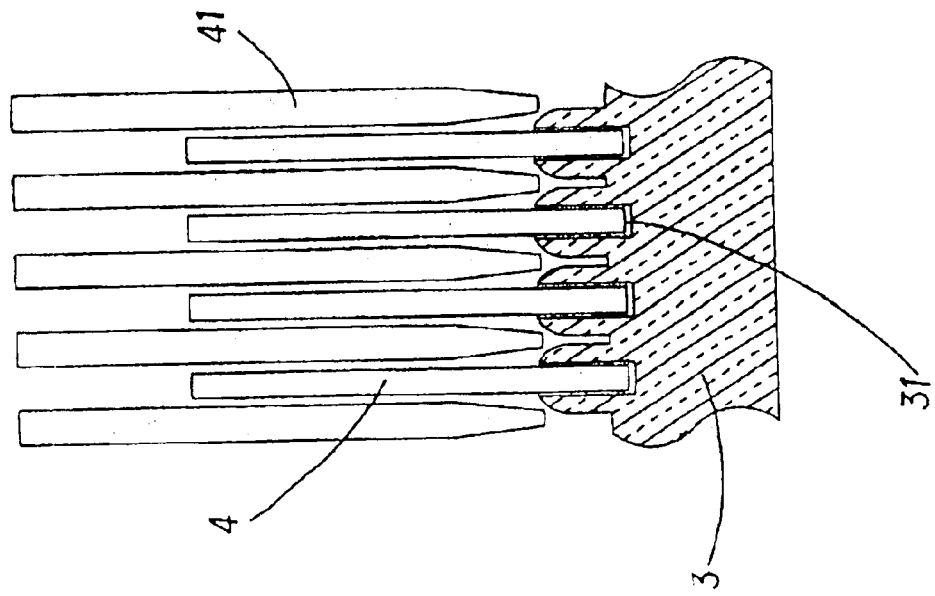
FIG. 2 (PRIOR ART)

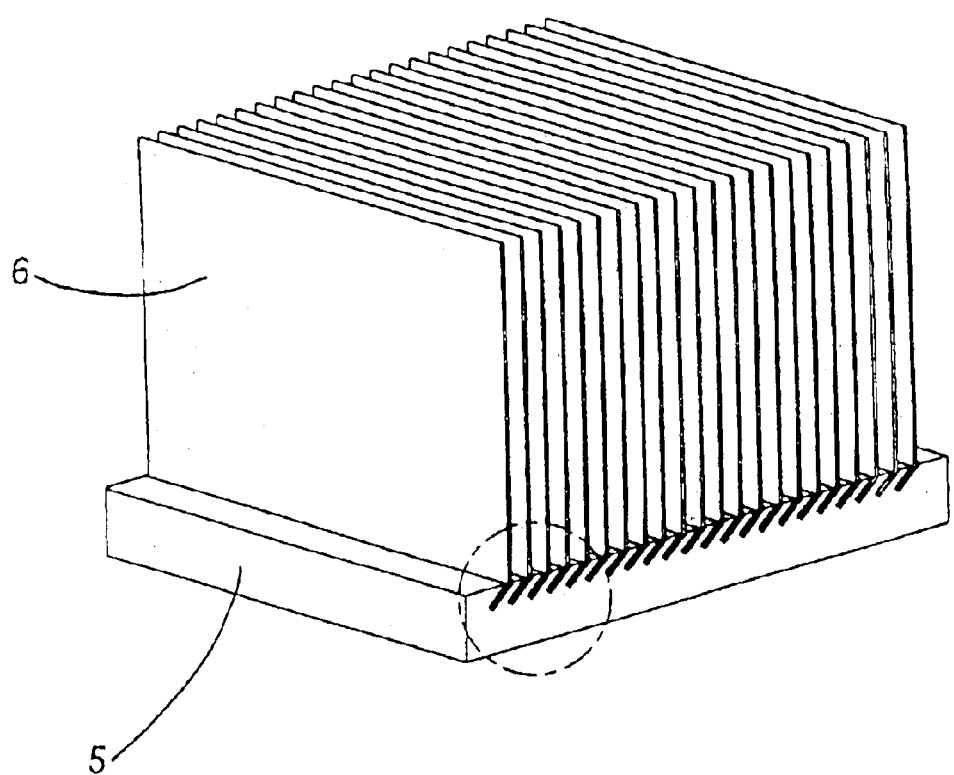
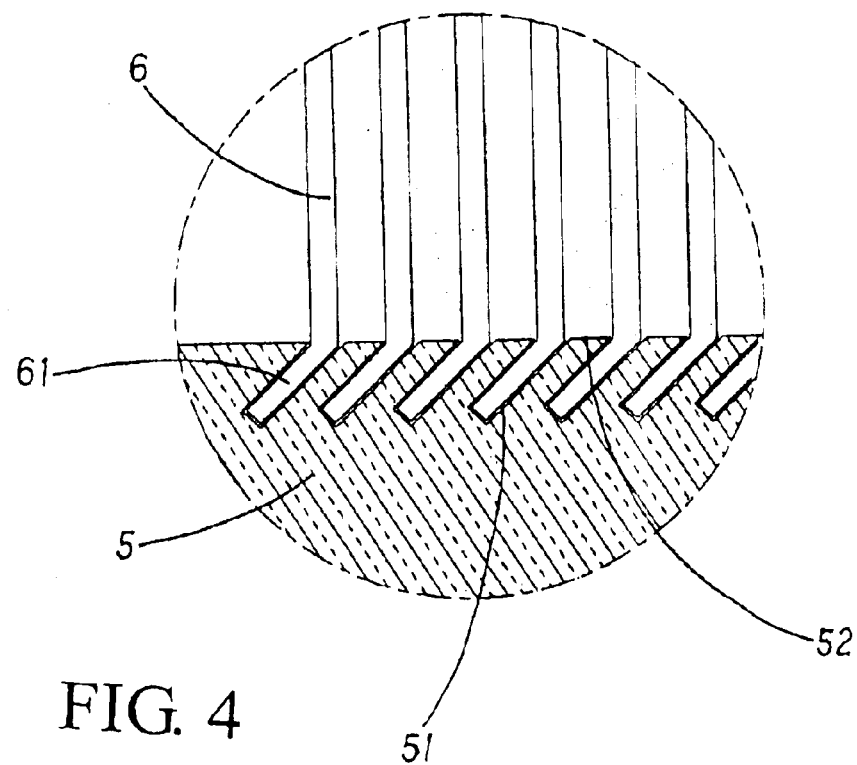
FIG. 4

US 6,754,078 B1

HEAT DISSIPATING DEVICE WITH SLANTING ENGAGED HEAT DISSIPATING SHEETS AND BOTTOM PLATE

FIELD OF THE INVENTION

The present invention relates to heat dissipating devices, and particularly to a heat dissipating device having slanting engaged heat dissipating sheets and a bottom plate.

BACKGROUND OF THE INVENTION

With the advance of integrated circuit (IC) technology, CPUs are made more and more compact and has higher operation speed than old ones. Thereby, a great deal of heat is generated. However in current trend, it is desired that the electronic devices have compact size, that is, they are smaller, and thus, it is required that the heat dissipating devices of the electronic devices are compact and has powerful heat dissipating ability.

With reference to FIGS. 1A and 1B, an assembled schematic view and a partial enlarged cross section view of a prior art IC heat dissipating device are illustrated. In that heat dissipating device, a plurality of recesses 11 are formed on a surface of a substrate 1. Each two recesses 61 are formed with a rib 12. There are a plurality of fins 2. Two sides of the lower end of the fin 2 are formed with respective extending portions 21. Thereby, the fin 2 can be inserted into the recess 11 (referring to FIG. 1A). Two side walls of the ribs 12 are punched by a plurality of punching weights so that the walls are expanded outwards to clamp the extending portions 2. Thereby, the fins 2 are firmly secured to the substrate 1 (referring to FIG. 1B), and thus an IC heat dissipating device is formed.

Although above said structure can be used, in punching the ribs, only the top end of the ribs 12 deform. The gaps are formed at lower ends between recesses 11 and the heat dissipating fins 2. If this heat dissipating device is placed on an IC. Heat will transfer to the substrate and thus to the heat dissipating fine 2. The heat can not be transferred to the whole fins 2 since the gaps at the lower ends between the recesses 11 and the heat dissipating fins 2.

Referring to FIG. 2, a schematic perspective view of another prior art IC heat dissipating device is illustrated. In FIG. 2, the substrate 3 is formed with a plurality of recesses 31. The heat dissipating fins 4 are placed in the recesses 31. A plurality of punching weights 41 punch the recesses 31 so that the wall of the recesses 31 deform and thus the heat dissipating fins 4 are clamped in the recesses tightly. Thereby, the assembly of the heat dissipating device is finished. However since a front end of the plurality of punching weights 41 are reduced to have a thinner end so that the punching weights 41 are drawn out easily. The pressure applied to the connection of the lower end of the recesses 31 and the heat dissipating fins 4 of heat dissipating device is sufficient. Thereby, gaps are generated at that place. Heat of the substrate 3 can not be sufficiently transferred to the heat dissipating fins 4 quickly. Thereby, the contact areas between the heat dissipating fins 4 and the recesses 31 are smaller so that the heat dissipating effect is not preferred.

SUMMARY OF THE INVENTION

Accordingly, the primary object of the present invention is to provide a heat dissipating device which comprises a bottom plate and plurality of heat dissipating sheets. A surface of the bottom plate is formed with a plurality of inclined recesses which are spaced with an equal space. Each inclined recess is inclined to a surface of the bottom plate and has two parallel sides, and every two adjacent recesses are spaced by a respective protruding rib. One end of each heat dissipating sheet has an inclined extending portion which has two parallel sides and is inclined to other portion of the heat dissipating sheet. The extending portions are inserted into the recesses of the bottom plate. By above structure, the heat dissipating sheets are inserted into the recesses of the bottom plate.

Another object of the present invention is to provide a heat dissipating device with slanting engaged heat dissipating sheets and a bottom plate, wherein the materials of the bottom plate and heat dissipating sheets are selected from one of copper and aluminum.

The various objects and advantages of the present invention will be more readily understood from the following detailed description when read in conjunction with the appended drawing.

BRIEF DESCRIPTION OF THE DRAWINGS

FIG. 1A is an assembled schematic view of a prior art heat dissipating device of an integrated circuit.

FIG. 1B is an enlarged partial cross section view of the prior art heat dissipating device of an integrated circuit.

FIG. 2 is a schematic perspective view of another prior art heat dissipating device of an integrated circuit.

FIG. 4 is a partial schematic cross section view showing that the heat dissipating sheets of the present invention are inserted into a bottom plate.

DETAILED DESCRIPTION OF THE PREFERRED EMBODIMENTS

Figure 3:
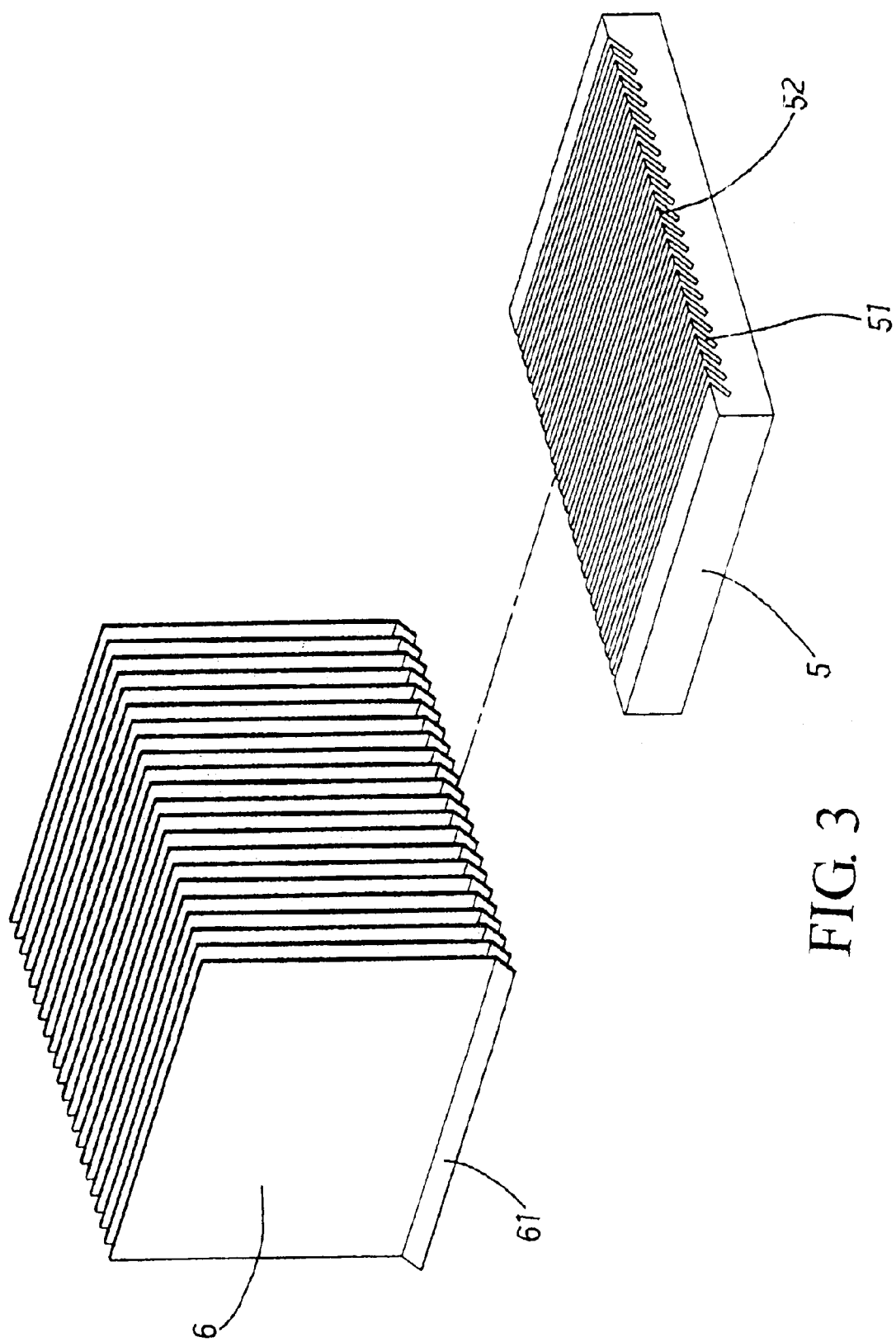
FIG. 3 is an exploded perspective view of the present invention.

Referring to FIGS. 3 and 4, the heat dissipating device with slanting engaged heat dissipating sheets and a bottom plate of the present invention is illustrated. The heat dissipating device includes a bottom plate 5 and a plurality of heat dissipating sheets 6. A surface of the bottom plate 5 is formed with a plurality of inclined recesses 51 which are spaced with an equal space, wherein each recess having two parallel sides. Every two adjacent recesses 51 are spaced by a respective protruding rib 52. A lower end of each heat dissipating sheet 6 has an inclined extending portion 61, wherein each extending portion 51 having two parallel sides. The extending portions 61 can be inserted into the recesses 51 of the bottom plate 5.

Figure 6:
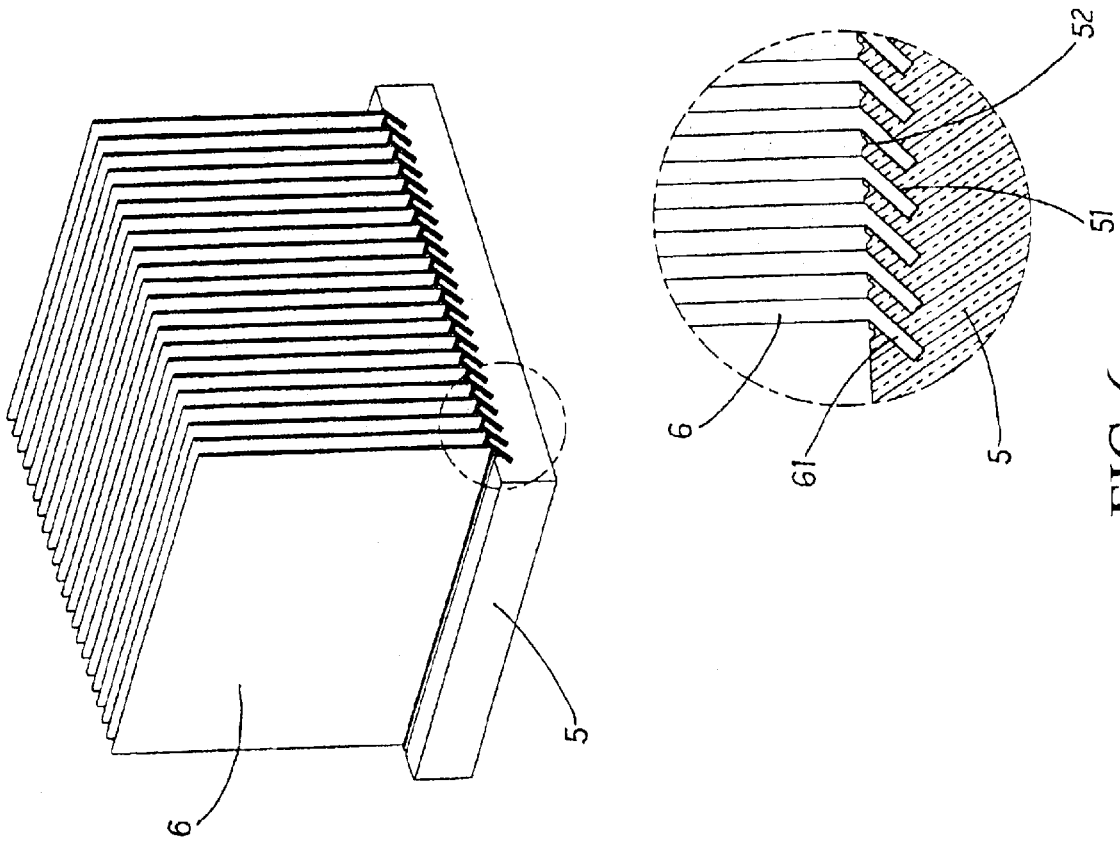
FIG. 6 is an assembled view of the present invention.
Figure 5:
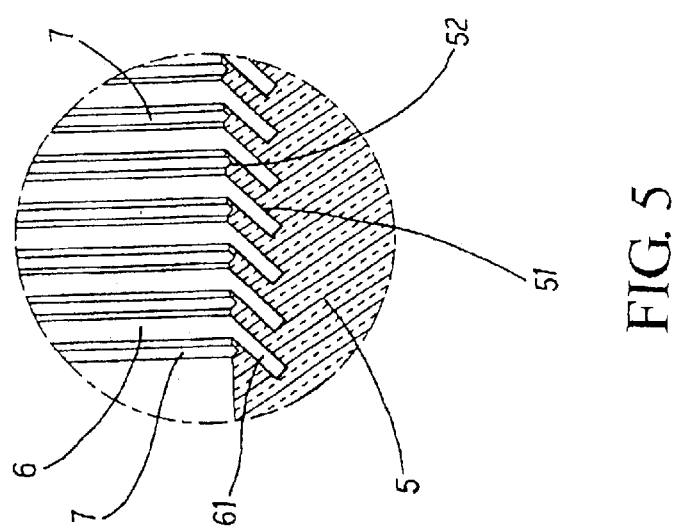
FIG. 5 is a schematic view showing the operation that a plurality of punching weights punch a bottom plate so as to extrude the protruding ribs and thus the protruding rib are deformed.

By above structure, the heat dissipating sheets 6 are inserted into the recesses 51 of the bottom plate 5. A plurality of punching sheets 7 punch the protruding ribs 52 of the bottom plate 5, as shown in FIG. 5, so that the protruding ribs 52 extrude downwards and thus the extending portions 61 of the heat dissipating sheets 6 are tightly secured to the recesses 51. Thereby, the two are combined as an integrally body, as shown in FIGS. 5 and 6. Thus, the heat dissipating sheets 6 in the recesses 51 of the bottom plate 5 are firmly secured therein.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A heat dissipating device comprising:

a bottom plate; a surface of the bottom plate being formed with a plurality of inclined recesses which are spaced with an equal space, wherein each inclined recess is inclined to a surface of the bottom plate and has two parallel sides, and every two adjacent recesses being spaced by a respective protruding rib;

a plurality of heat dissipating sheets; one end of each heat dissipating sheet having an inclined extending portion which has two parallel sides and is inclined to other portion of the heat dissipating sheet; the extending portions being inserted into the recesses of the bottom plate;

wherein by above structure, the heat dissipating sheets are inserted into the recesses of the bottom plate.

2. The heat dissipating device as claimed in claim 1, wherein the materials of the bottom plate and heat dissipating sheets are selected from one of copper and aluminum.

* * * * *